(12) United States Patent
Zheng et al.

(10) Patent No.: US 7,485,486 B2
(45) Date of Patent: Feb. 3, 2009

(54) PHOTODIODE FOR MULTIPLE WAVELENGTH OPERATION

(75) Inventors: Dong Zheng, San Jose, CA (US); Phillip J. Benzel, Pleasanton, CA (US); Joy Jones, Fremont, CA (US); Alexander Kalnitsky, San Francisco, CA (US); Perumal Ratman, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 128 days.

(21) Appl. No.: 11/532,762

(22) Filed: Sep. 18, 2006

(65) Prior Publication Data

US 2007/0072326 A1 Mar. 29, 2007

Related U.S. Application Data

(63) Continuation-in-part of application No. 11/378,843, filed on Mar. 17, 2006, now abandoned.

(60) Provisional application No. 60/813,910, filed on Jun. 15, 2006, provisional application No. 60/663,239, filed on Mar. 18, 2005.

(51) Int. Cl.
*H01L 21/00* (2006.01)

(52) U.S. Cl. .................... 438/48; 438/142; 438/208; 438/309; 438/356; 257/E25.001; 257/E25.032

(58) Field of Classification Search .............. 438/48, 438/142, 309; 257/E25.001, E25.032
See application file for complete search history.

(56) References Cited

U.S. PATENT DOCUMENTS 6,743,652 B2 6/2004 Thomas et al.

(Continued)

FOREIGN PATENT DOCUMENTS

JP 2003-163344 6/2003

(Continued)

OTHER PUBLICATIONS

Fukunaga et al. "SI-OEIC (OPIC) For Optical Pickup", IEEE Transactions on Consumer Electronics, (1997), vol. 43, No. 2, pp. 157-164.

(Continued)

*Primary Examiner*—Walter L Lindsay, Jr.
*Assistant Examiner*—Abdulfattah Mustapha
(74) *Attorney, Agent, or Firm*—Fliesler Meyer LLP

(57) ABSTRACT

A method of a fabricating a multiple wavelength adapted photodiode and resulting photodiode includes the steps of providing a substrate having a first semiconductor type surface region on at least a portion thereof, implanting and forming a second semiconductor type shallow surface layer into the surface region, and forming a multi-layer anti-reflective coating (ARC) on the shallow surface layer. The forming step includes depositing or forming a thin oxide layer on the shallow surface layer and depositing a second dielectric layer different from the thin oxide layer on the thin oxide layer. An etch stop is formed on the second dielectric, wherein the etch stop includes at least one layer resistant to oxide etch. At least one oxide including layer (e.g. ILD) is then deposited on the etch stop. The oxide including layer and etch stop are then removed to expose at least a portion of the ARC to the ambient.

19 Claims, 8 Drawing Sheets

U.S. PATENT DOCUMENTS

2004/0012021 A1    1/2004   Hosokawa et al.
2005/0186754 A1*   8/2005   Kim ............................ 438/401
2005/0287479 A1*  12/2005   Moon ......................... 430/330

FOREIGN PATENT DOCUMENTS

JP        2004047544        2/2004

OTHER PUBLICATIONS

Zimmermann et al. "Advanced Photo Integrated Circuits in CMOS Technology", IEEE Electronics Components and Technology Conference, 1999, pp. 1030-1035.

Ghazi et al. "CMOS Photodiode With Enhanced Responsivity for the UV/Blue Spectral Range", IEEE Transaction on Electron Devices, (2002) vol. 49, No. 7, pp. 1124-1128.

Fukunaga, et al., "SI-OEIC (OPIC) for Optical Pickup," IEEE Transactions on Consumer Electronics, vol. 43, No. 2, May 1997, pp. 157-164.

Ghazi et al., "CMOS Photodiode with Enhanced Responsivity for the UV/Blue Spectral Range," IEEE Transactions on Electron Devices, vol. 49, No. 7, Jul. 2002, pp. 1124-1128.

Zimmerman et al., "Advanced Photo Integrated Circuits in CMOS Technology", 49th Electronic Components and Technology Conference, San Diego, Jun. 1-4, 1999, USA, pp. 1030-1035.

* cited by examiner

US 7,485,486 B2

PHOTODIODE FOR MULTIPLE WAVELENGTH OPERATION

CROSS-REFERENCE TO RELATED APPLICATIONS

The present application claims priority to Provisional Patent Application No. 60/813,910 entitled "PHOTODIODE FOR MULTIPLE WAVELENGTH OPERATION" filed on Jun. 15, 2006; and is a continuation-in-part (CIP) of U.S. patent application Ser. No. 11/378,843 entitled "PHOTODIODES WITH ANTI-REFLECTION COATING" filed on Mar. 17, 2006, now abandoned which claims priority to Provisional Patent Application No. 60/663,239 filed on Mar. 18, 2005, all of which are incorporated by reference in their entireties into the present application.

FIELD OF THE INVENTION

The invention generally relates to photodiodes, and more particularly to semiconductor photodiodes that have at least one anti-reflective layer, and processes for fabrication to form integrated circuit devices that include photodiodes.

BACKGROUND OF THE INVENTION

The structure and function of semiconductor photodiodes are well known. Photodiodes convert photons into electrical energy. Conventional photodiodes operate in the visible and near-infrared range of the electromagnetic radiation spectrum. The particular semiconductor materials used determine the particular wavelength or wavelength range of the radiation to which the photodiode responds. Photodiodes can be fabricated from elemental semiconductors, such as silicon, as well as compound semiconductors, such as gallium-arsenide.

Photodiodes are typically either vertical P+N or N+P structures. Although a P+N diode is described in this paragraph, by reversing the diffusion types, an N+P diode will be formed. (This is also called a PIN structure, with "I" indicating the intrinsic layer). A conventional P+N photodiode includes a surface P-type anode region to which an anode contact is formed. An antireflective film generally overlies the P-type region to assure a high degree of transmission of radiation at the wavelength that the photodiode is designed to absorb. Beneath the P-type region is a very lightly-doped N-type drift region (also called the intrinsic region or space charge region in the literature) in which photons of the incident radiation are absorbed, generating hole-electron pairs. Adjoining the N-type drift region is a heavily-doped N+ cathode region, to which a cathode contact is formed at a surface of the device. In operation the P+N junction between the P-type anode region and the N-type drift region is reverse biased by an applied potential expanding the depletion layer on both sides of the junction. Because the N-type drift region is relatively lightly doped, the depletion layer is predominantly on the N-type side of the junction extending deeply into the drift region. Holes and elections generated in the depletion layer are swept in opposite directions in response to the applied potential, thus providing a current that is a function of the intensity of the incident radiation.

In many applications photodiodes are formed on integrated circuit die. As a result, when integrating photodiodes on the same semiconductor chip as other circuit elements such as transistors and resistors to perform complex functions in response in part to incident radiation signals, the constraints of the process for making such other elements must be considered in the design of the photodiode. It is desirable to minimize the complexity of a semiconductor fabrication process while maximizing the flexibility available to the designer to provide complex functionality in the device design. The inclusion of a photodiode on an integrated circuit chip made with state-of-the-art CMOS or BiCMOS process technology contributes to the foregoing design considerations.

Photodiodes in certain applications must be efficient, and/or provide substantially the same efficiency, over a relatively wide range of wavelengths, such as blue to red light, even in the face of changing process parameters. FIG. 1 shows the normalized optical response of an exemplary photodiode having a $3^{rd}$ order anti-reflective coating (ARC) optimized for blue light, for red (650 nm), near infrared (IR; 780 nm) and blue (405 nm) light as a function of silicon dioxide thickness (in microns) above the photodiode. The oxide film stack over the photodiode comprising the inter-level dielectric (ILD) is a by-product of forming the multi-level metal interconnect. Because the ARC layer is generally optimized for blue light, the optical response at the three different wavelengths (such as used in optical storage products) can be seen to be a strong function of the oxide thickness over the photodiode, especially for red and IR.

Moreover, the thickness of respective oxide films forming the ILD are not well controlled due to thickness variability predominantly due to ILD layer deposition and planarization processing. Oxide (or other dielectric) thickness variability is generally both across a wafer or die, wafer to wafer, and lot-to-lot. Such variability in the thickness of layers disposed on top of the photodiode ARC can result in substantial loss and/or variation in efficiency. What is needed is a new photodiode architecture which provides multiple wavelength operation and a manufacturable process for forming the same.

SUMMARY OF THE INVENTION

A method of a fabricating multiple wavelength adapted photodiodes and resulting photodiodes includes the steps of providing a substrate having a first semiconductor type surface region on at least a portion thereof, implanting and forming a second semiconductor type shallow surface layer into the surface region, and forming a multi-layer anti-reflective coating (ARC) on the shallow surface layer. The forming step includes depositing or forming a thin oxide layer on the shallow surface layer and depositing a second dielectric layer different from the thin oxide layer on the thin oxide layer. An etch stop is formed on the second dielectric, wherein the etch stop includes at least one layer resistant to oxide etch. At least one oxide comprising layer (e.g. ILD) is then deposited on the etch stop. The oxide comprising layer and then the etch stop are removed to expose at least a portion of the ARC to the ambient.

The first semiconductor type can be p-type and the second semiconductor type can be n-type, such as As or Sb. In another embodiment, the first semiconductor type is n-type and the second semiconductor type is p-type.

A thickness of the thin oxide layer is preferably between 1.5 nm and 5 nm, such as between 2.0 to 4.0 nm. The second dielectric layer can comprise silicon nitride.

Following the removal of the etch stop to expose said ARC the etch stop layer can remain exclusively on a periphery of the ARC. The layer resistant to oxide etch can comprise silicon nitride or polysilicon.

A photodiode comprises a substrate having a first semiconductor type surface region on at least a portion thereof, a second semiconductor type shallow surface layer diffused into the surface region. A multi-layer anti-reflective coating (ARC) is disposed on the shallow surface layer, wherein said ARC comprises a thin oxide layer on the shallow surface layer and a second dielectric layer different from the thin oxide layer on the thin oxide layer. At least a portion of the ARC is exposed to the ambient. The photodiode can further comprise a layer resistant to oxide etch disposed on a periphery of the ARC, such as silicon nitride or polysilicon. The thin oxide layer is preferably between 1.5 nm and 5 nm. The second dielectric layer can comprise silicon nitride.

BRIEF DESCRIPTION OF THE DRAWINGS

A fuller understanding of the present invention and the features and benefits thereof will be accomplished upon review of the following detailed description together with the accompanying drawings, in which.

DESCRIPTION OF THE PREFERRED EMBODIMENTS

A method of a fabricating multiple wavelength adapted photodiodes and resulting photodiodes includes the steps of providing a substrate having a first semiconductor type surface region on at least a portion thereof, implanting and forming a second semiconductor type shallow surface layer into the surface region, and forming a multi-layer anti-reflective coating (ARC) on the shallow surface layer. The forming step includes depositing or forming a thin oxide layer on the shallow surface layer and depositing a second dielectric layer different from the thin oxide layer on the thin silicon dioxide layer. As used herein, "thin silicon dioxide layer" refers to a silicon dioxide thickness of 1.5 to 20 nm, preferably being 1.5 to 8 mm. With the ARC as described herein, ≦+/−2% variation in efficiency have been obtained across the photodiode as compared to around 10% without the ARC.

An etch stop is formed on the second dielectric, wherein the etch stop includes at least one layer resistant to oxide etch. At least one oxide comprising layer (e.g. ILD layers) is then deposited on the etch stop. The oxide comprising layer and then the etch stop are removed to expose at least a portion of the ARC to the ambient.

Figure 2:
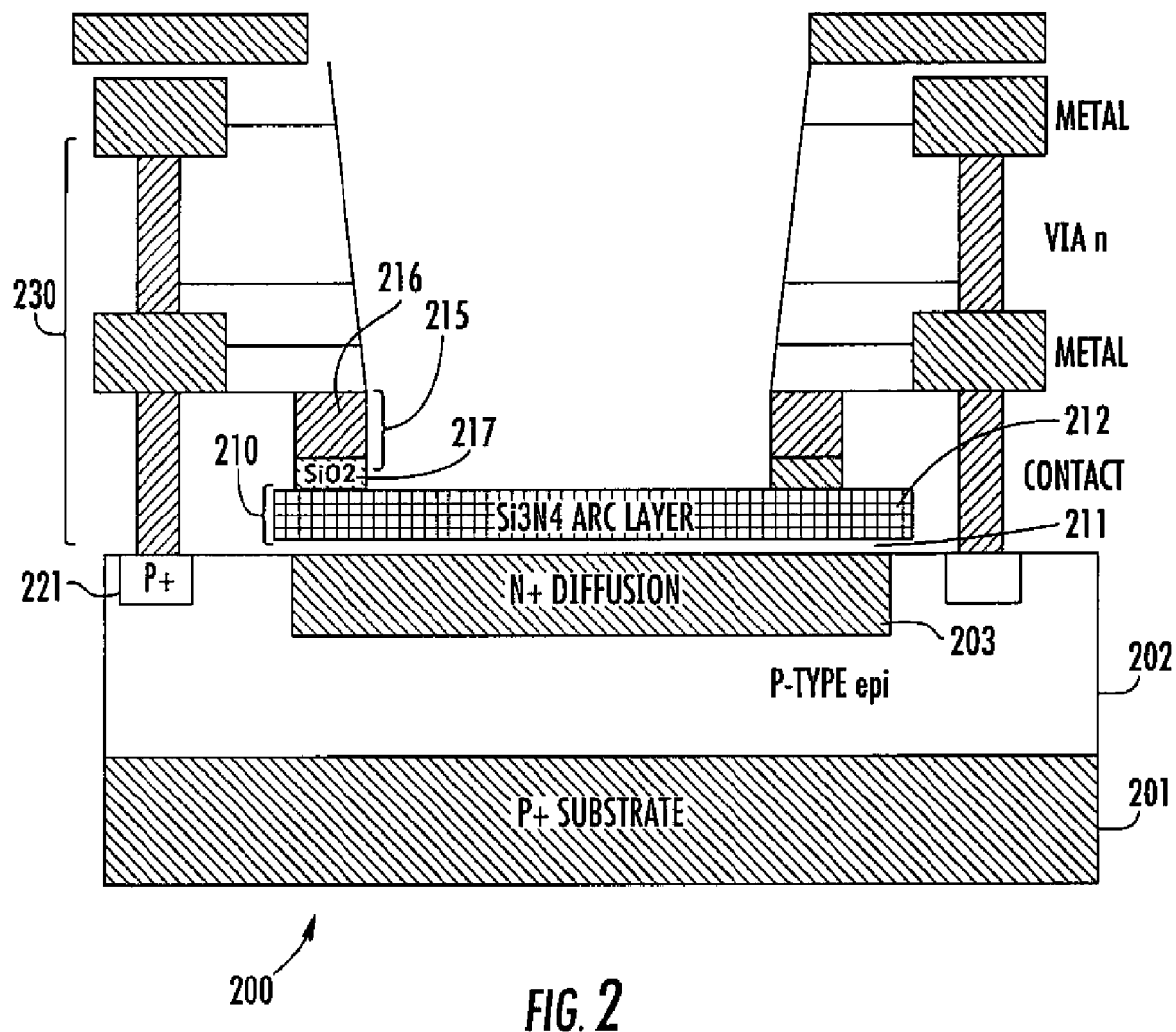
FIG. 2 shows a cross section of the resulting photodiode structure for multi-wavelength detection according to the invention following standard CMOS multi-level metal processing including contact etch, metallization, CVD ILD deposition and planarization.

A cross sectional view of a N+P photodiode 200 according to the invention is shown in FIG. 2. A P+ substrate 201 having a p-surface region 202 on at least a portion thereof has a shallow n-type surface layer 203 (labeled N+ diffusion) formed into the surface region 202. The n-type surface layer 203 preferably comprises As or Sb. Metallization 230 is coupled to a P+ contact 221 for low resistance contact to p-surface region 202. N+ diffusion contacts are not shown in FIG. 2.

A multilayer anti-reflective coating (ARC) 210 is disposed on the n-type surface layer 203. The ARC shown preferably comprises silicon nitride as the second dielectric 212 on thin silicon dioxide 211. As shown, the silicon nitride ARC layer 212 extends beyond the N+ diffusion 203 to ensure a good seal structure for the photodiode 200.

The thin silicon dioxide layer (e.g. 1.5 to 8 nm) disposed between the ARC nitride layer 212 (or other second dielectric) and the Si surface of the photodiode is used to reduce tension/stress between the Si and the silicon nitride or other second dielectric. For optical performance, a 1.5 nm to 4 nm thick, such as a 2 nm or 3 nm thick, silicon dioxide layer is preferred. Since the silicon dioxide layer has been found by the Inventors to begin to affect the reflected phase wave for thin oxide thicknesses of about 4 nm to 5 nm or greater, the nitride thickness is preferably thinned slightly to account for the thin silicon dioxide layer, and to restore the optical performance of the device to an optimum or near optimum value. For example, if the silicon dioxide layer is 5 nm thick, the optimum nitride thickness is reduced from 145 nm to about 140 nm for 405 nm operation. The thickness tolerance of the second dielectric layer should be within +/−10 nm of the calculated optimum value as described below, and is preferably within +/−5 nm.

In the case of the second dielectric being silicon nitride, the nitride thickness is preferably found using the following relation (where 2.1 is assumed to be the refractive index of the silicon nitride):

Thickness=n*(¼ of the optical wavelength in nitride), where n=1, 3 or 5, . . . For 405 nm optimized operation, using n=1, the preferred nitride thickness is:

(¼*405 nm)/2.1=48 nm, while n=3 results in a thickness of 144 nm.

The ARC second dielectric 212 generally has a refractive index significantly greater than the refractive index of silicon dioxide. Although the second dielectric is generally described herein as being silicon nitride, the invention is not limited to silicon nitride as the second dielectric. For example, the second dielectric can be silicon rich $SiO_2$, silicon rich SiON or silicon rich $Si_3N_4$. One known method for depositing such silicon rich layers is using plasma enhanced deposition systems.

A thickness of the second dielectric layer 212 is preferably equal to an odd integer multiplied by ¼ of the optical wavelength in the second dielectric for optimized response. In a preferred embodiment, the refractive index of the second dielectric layer is found by taking the square root of the product of the refractive index of the shallow surface layer and the silicon dioxide layer interlayer dielectric (ILD) generally disposed on the dense dielectric layer $(3.75*1.46)^{1/2}$=2.33 (optimized for blue light; 405 mm).

The thicknesses of thin oxide layer and second dielectric layer 212 comprising the ARC are selected depending on the wavelength of the light to which the photodiode is designed to best respond in its end-use application. The thicknesses are selected to achieve at least 99% transmission of the incoming light through the second dielectric and oxide layers down into the underlying silicon using the formula given above. By way of example, for optimization for a 405 nm (blue) optical wavelength, the ARC preferably comprises a 130 to 150 nm thick silicon nitride layer on top of a silicon dioxide layer having a thickness of less than 6 nm. It has been found that the reflection for 405 nm light for a N+P structure according to the invention when an As surface layer is provided can be reduced to less than 1% (>99% transmission).

Anti-reflection coatings (ARC) are known to increase photodetector responsivity. ARC coatings according to the invention strongly reduce undesired effects from optical interference thus largely eliminating optical interference. As noted above, reflections can be reduced to less than 1%, thus increasing photodiode efficiency.

The remnants of etch stop 215 based on the preferred method according to the invention is disposed on a periphery of photodiode 200. Etch stop 215 comprises a layer resistant to oxide etch 216, such as silicon nitride or polysilicon, disposed on an oxide or other layer 217.

The P-substrate 201 can be a silicon substrate having a resistivity of about 10 to 20 ohm-cm. Alternatively, the p-surface region can be a p-well diffused into an n-substrate, or a p-surface epitaxial film on a P+ substrate as shown in FIG. 2.

The phrase "shallow surface layer", as used herein, generally refers to a 100 nm to 500 nm deep junction depth. In a preferred embodiment, for N+P photodiodes, the surface layer is As formed using an As implant dosage of $1 \times 10^{14}$ to $5 \times 10^{14}/cm^2$ at about 10 to 25 keV. Alternatively, other heavy/slow diffusing n-type Si dopants, including antimony (Sb) or even bismuth (Bi), can be used. A second N-type implant (e.g. Phosphorus) of 10-100 times lower dose than the first N-type implant (and enclosing the first implant) may beneficial if contacts are formed directly to the detector cathode.

For P+N photodiodes, the shallow surface layer generally utilizes B, but can also include other Group III elements, such as In. For B, the implant energy is generally 3-10 keV, or if the molecular ion $BF_2$ is used, the energy is generally 30 to 70 keV. For In, the energy is generally 10 keV to 35 keV. Doses are similar to As doses described above. The P+ region can be surrounded by a P- (lighter implant, e.g. B) similar to the N+P diode construction described in the paragraph above.

The process flow including ARCs according to the invention is compatible with most standard CMOS OR BiMOS processes. Only minor process changes to standard processes are generally needed to implement both the ARC and the etch stop.

Although various conventional semiconductor device fabrication techniques can be used to make either N+P or P+N photodiodes according to the invention, an exemplary process sequence for forming N+P photodiodes is described below. The exemplary process described below starts with the step of the shallow As photodiode (PD) implant, which is preferably before the source/drain implant in the process sequence to eliminate adverse effects of high temperature associated with the ARC/etch stop layer processing on CMOS devices.

Figure 3A:
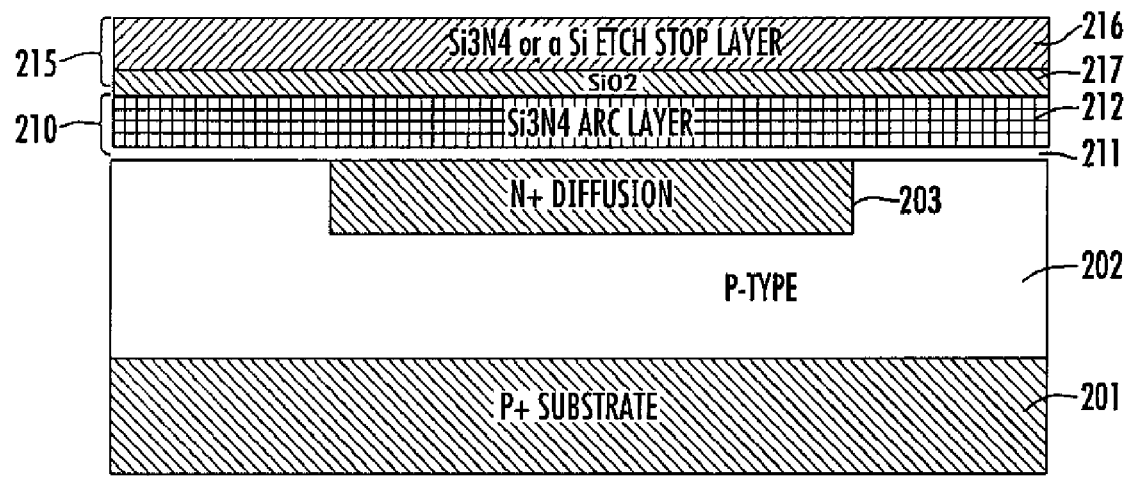
FIG. 3(a) shows a cross sectional schematic of the in-process photodiode after forming the etch stop layer stack on the ARC.
Figure 3B:
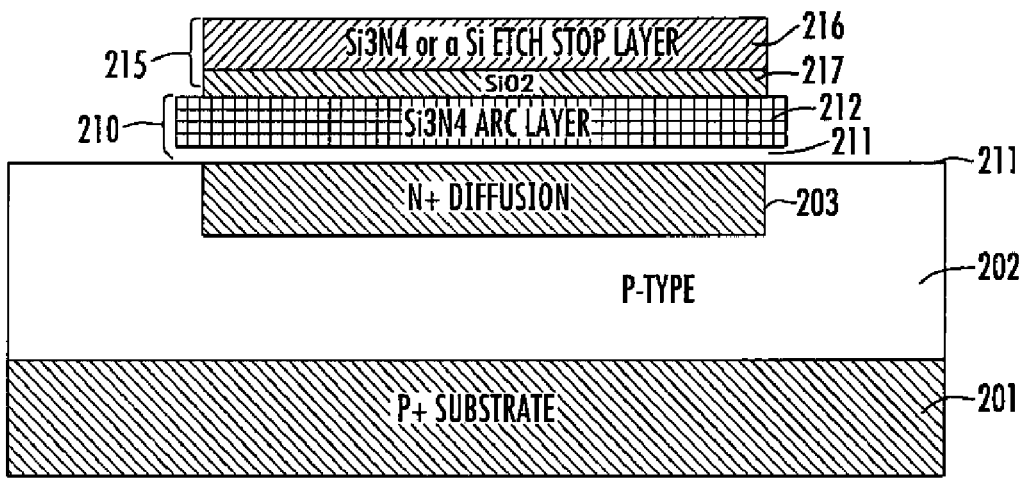
FIG. 3(b) shows a cross sectional schematic of the in-process photodiode after resist patterning on top of the photodiode followed by an etch to remove the etch stop stack and ARC outside the photodiode, and resist removal.

FIG. 3(a) shows a cross sectional schematic of the photodiode after forming of the etch stop layer stack 215 on the ARC 210. On top of the ARC is a $SiO_2$ layer 215 (e.g. 300 A to 2,000 A) and a non-oxide stop layer 216 (e.g. $Si_3N_4$ ~1,500 A to 2,500 A or a polysilicon layer ~1,500 A to 2,000 A) on the $SiO_2$ layer. Following resist patterning on top of the photodiode followed by an etch to remove the etch stop and ARC outside the photodiode, and resist removal, the cross sectional schematic of the photodiode shown in FIG. 3(b) results.

The etch stop layer etch must generally also clear the etch stop material from the CMOS gate topography (not shown). In case of the Si etch stop a variety of plasma etches stopping on the underlying oxide can be used. In case of a $Si_3N_4$ etch stop layer, plasma or wet etches can be employed, the latter generally including an oxide hard mask material (~30 nm or thicker) deposited over the $Si_3N_4$ etch stop layer. The oxide layer between the ARC and the etch stop layer is preferably removed using wet chemistry prior to the photo resist mask removal.

The ARC $Si_3N_4$ layer is preferably removed using wet chemistry due to difficulties with stopping the nitride plasma etch with the large overetch generally required to clear the CMOS topography on a very thin underlying oxide. In this case the $Si_3N_4$ etch stop layer is generally protected by the overlying oxide layer.

Figure 4:
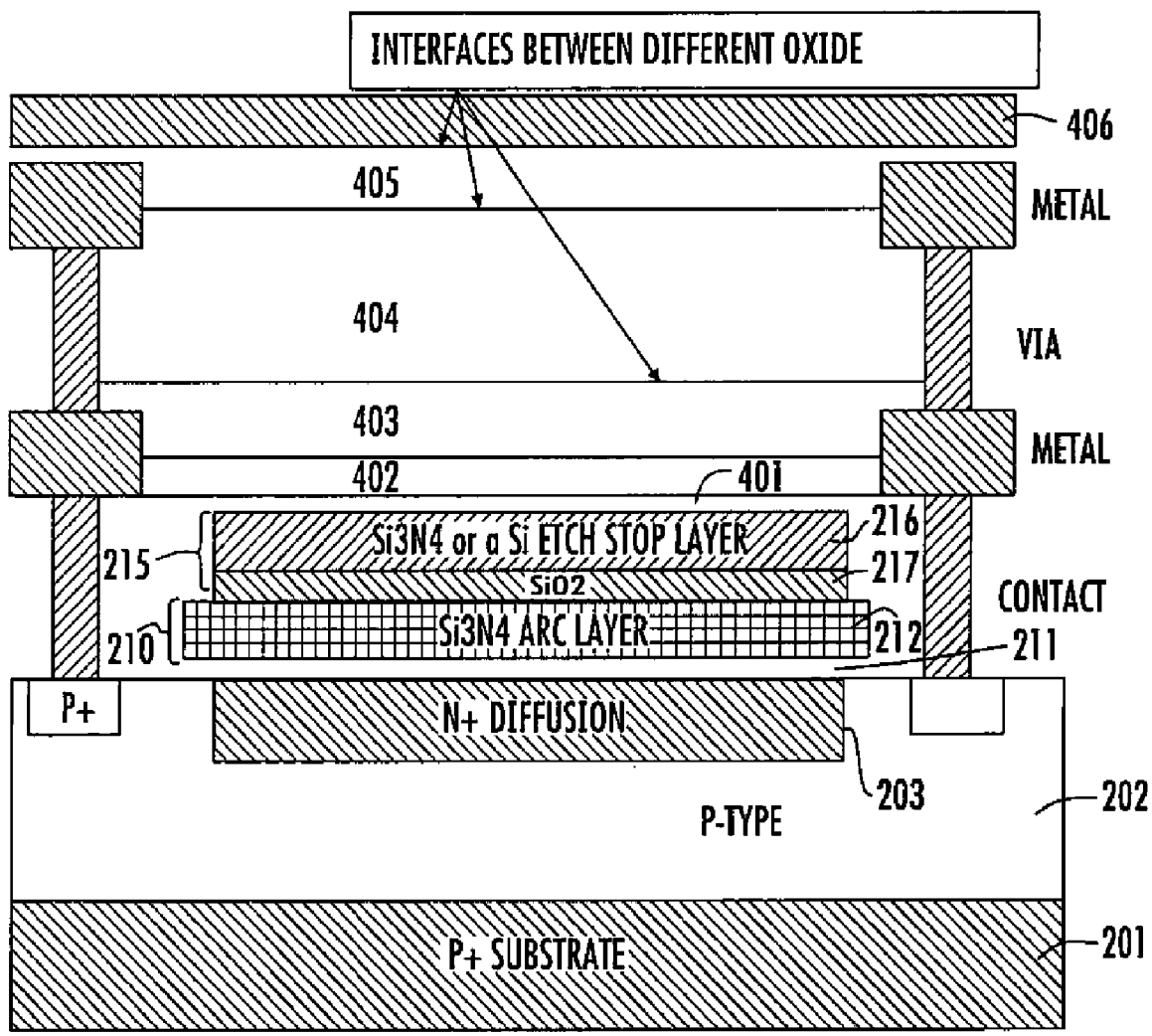
FIG. 4 shows a cross sectional schematic of the in-process photodiode structure following ILD, metal, contact, via and passivation processing.
Figure 5:
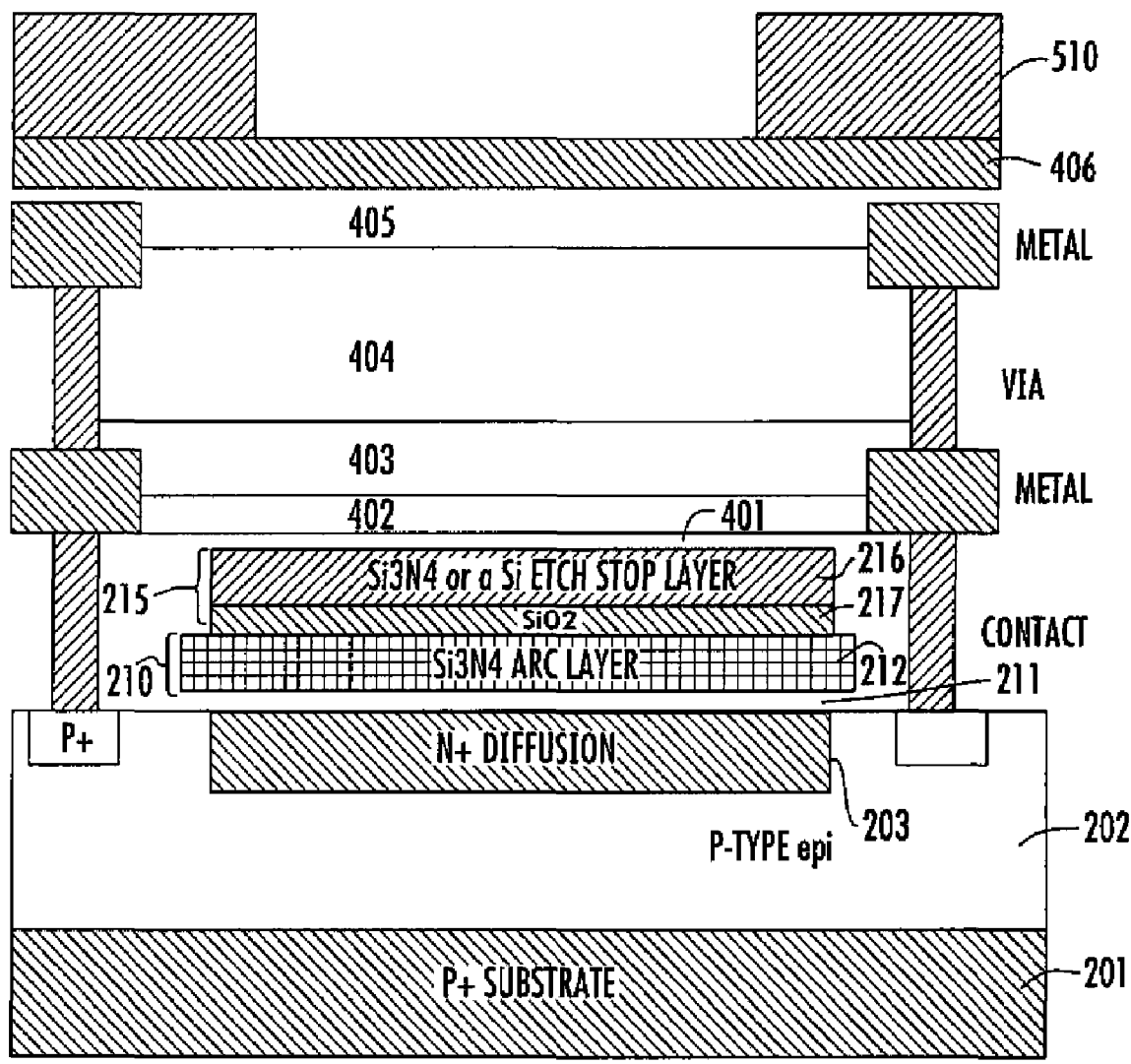
FIG. 5 shows a cross sectional schematic of the in-process photodiode structure following passivation layer deposition, photoresist patterning to open a window over the photodiode having an area less than the photodiode and the ARC layer pattern disposed over the photodiode.
Figure 6:
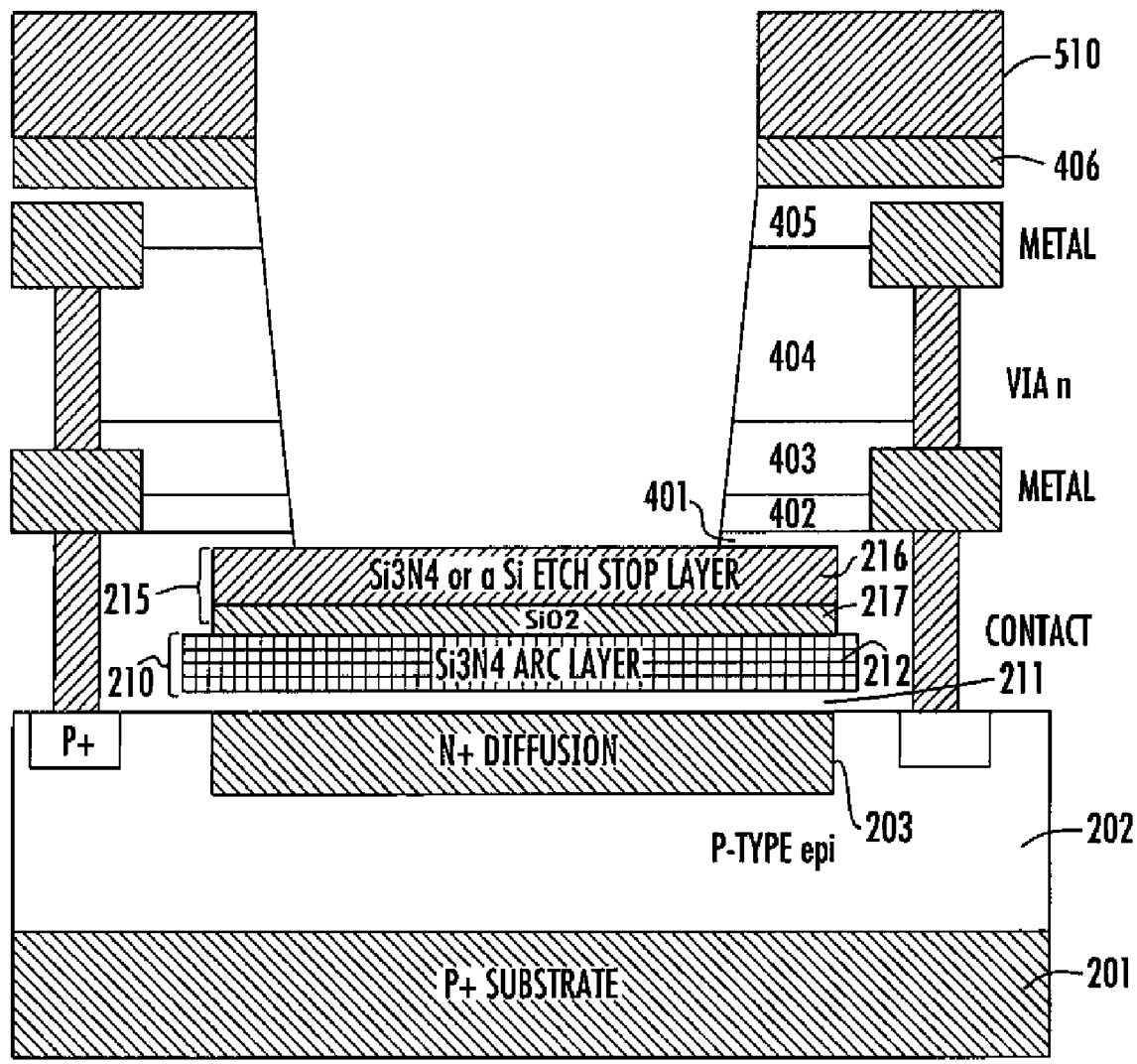
FIG. 6 shows a cross sectional schematic of the in-process photodiode structure following etch of the passivation and oxide ILD layers, the etch is stopped on/in the etch stop layer with the photodiode.
Figure 7:
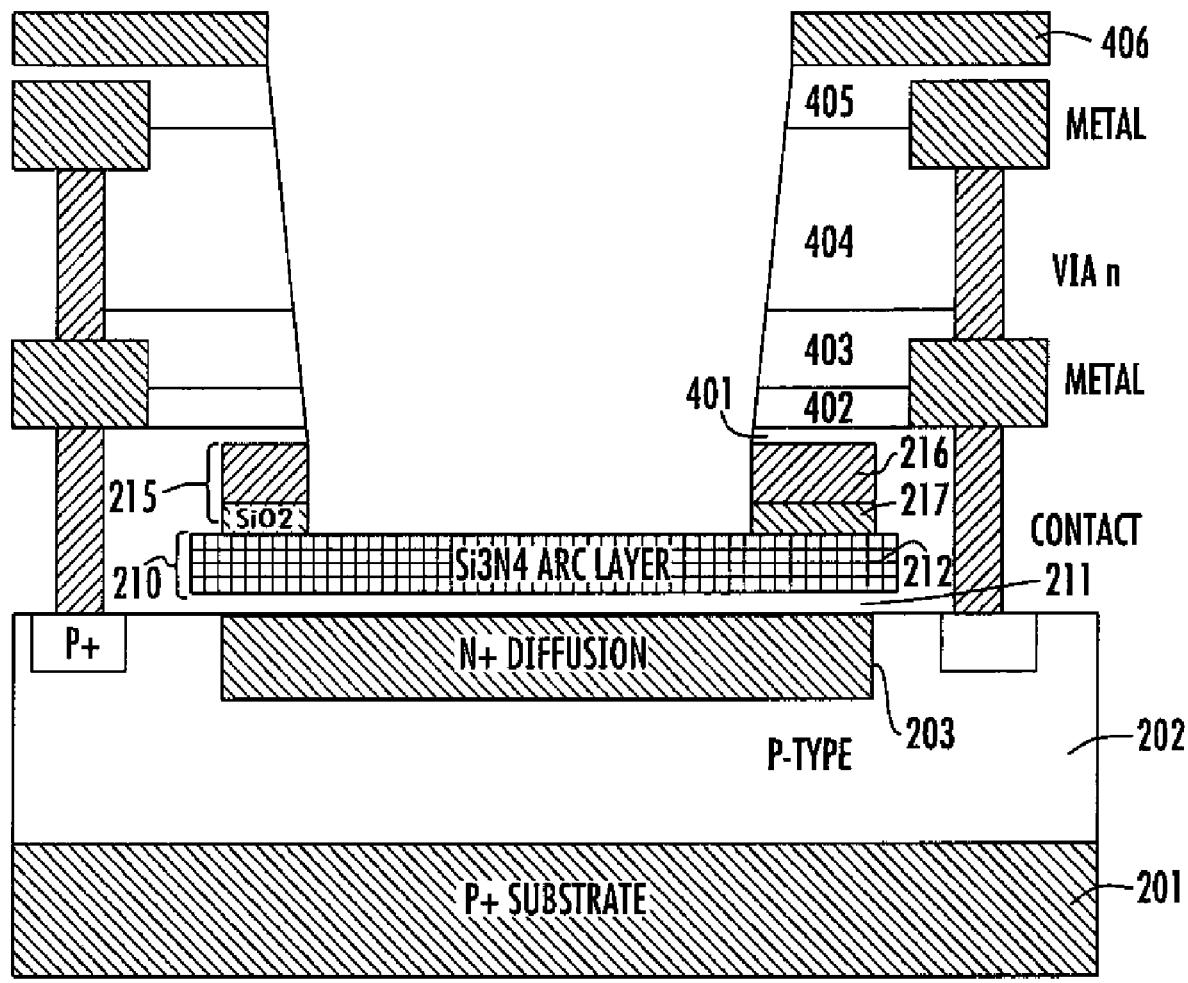
FIG. 7 shows a cross sectional schematic of the in-process photodiode structure following etch of the upper etch stop layer, such as silicon nitride or polysilicon, followed by silicon dioxide etch, typically a wet etch, followed by resist removal. The ARC layer is seen to be open to the ambient except at its periphery.

FIG. 4 shows a cross sectional schematic of the photodiode structure following ILD, metal, contact, via and passivation processing. ILD layers are shown as 401-405. Passivation layer is shown as reference 406. Arrows point to interfaces between different dielectric layers which adversely affect photodiode performance for photodiodes before the present invention. Following passivation layer deposition, such as an oxide layer capped with a nitride layer, photoresist 510 is patterned to open a window over the photodiode having an area less than the photodiode resulting in the structure shown in FIG. 5. Following etch of the passivation and oxide ILD layers, the etch is stopped on/in the etch stop layer 216 with the photodiode resulting in the structure shown in FIG. 6. FIG. 7 shows the photodiode resulting structure following etch of the upper etch stop layer, such as silicon nitride or polysilicon, followed by silicon dioxide etch, typically a wet etch, followed by resist removal. The ARC layer is seen to be open to the ambient except at its periphery.

A plurality of PMOS and NMOS transistors and photodiodes according to the invention can be elements of an integrated circuit that is useful in various different applications in which light signals are used as inputs to electronic circuitry within a larger apparatus or system. Photodiodes can be structured to respond to blue light, other desired wavelengths, or a broad range of wavelengths.

For example, photodiodes according to the invention integrated monolithically with CMOS circuits with a high sensitivity are needed for optical storage systems, such as digital versatile disk (DVD) or digital video recorders (DVR). Photodiodes according to the invention are also well suited for photodetectors for optical storage applications.

EXAMPLES

It should be understood that the Examples described below are provided for illustrative purposes only and do not in any way define the scope of the invention.

A simulation was performed to access photodiode response as a function of ARC nitride thickness. The ARC thickness was $3^{rd}$ order optimized for blue light (405 nm) being about 0.144 um. Overlaying oxide (ILD) and passivation were removed as described above.

Figure 1:
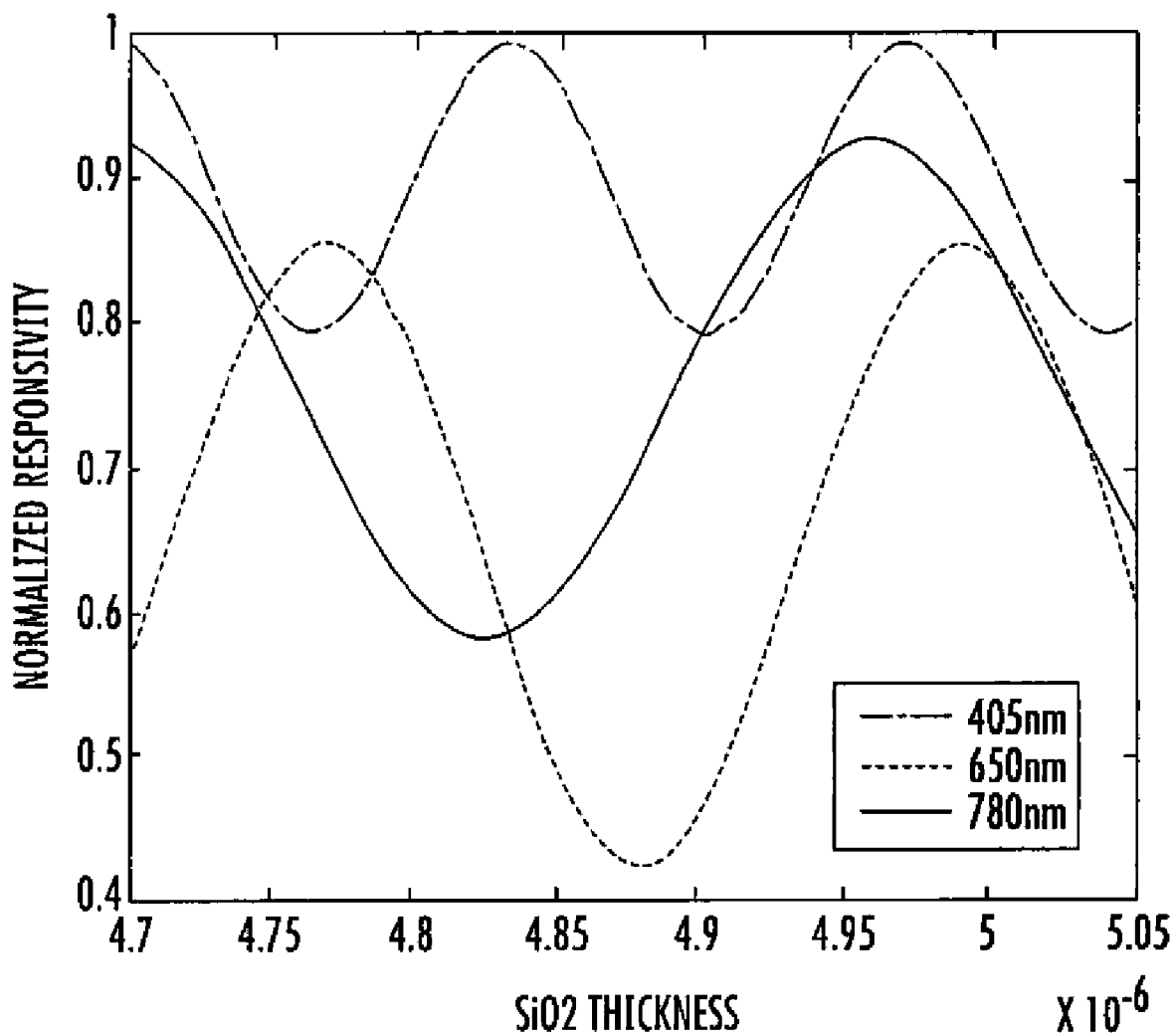
FIG. 1 shows the normalized optical response of an exemplary photodiode having a $3^{rd}$ order anti-reflective coating (ARC) optimized for blue light, for red, IR and blue light as a function of silicon dioxide thickness (in microns) over the photodiode which illustrates the problem largely solved by the present invention.
Figure 8:
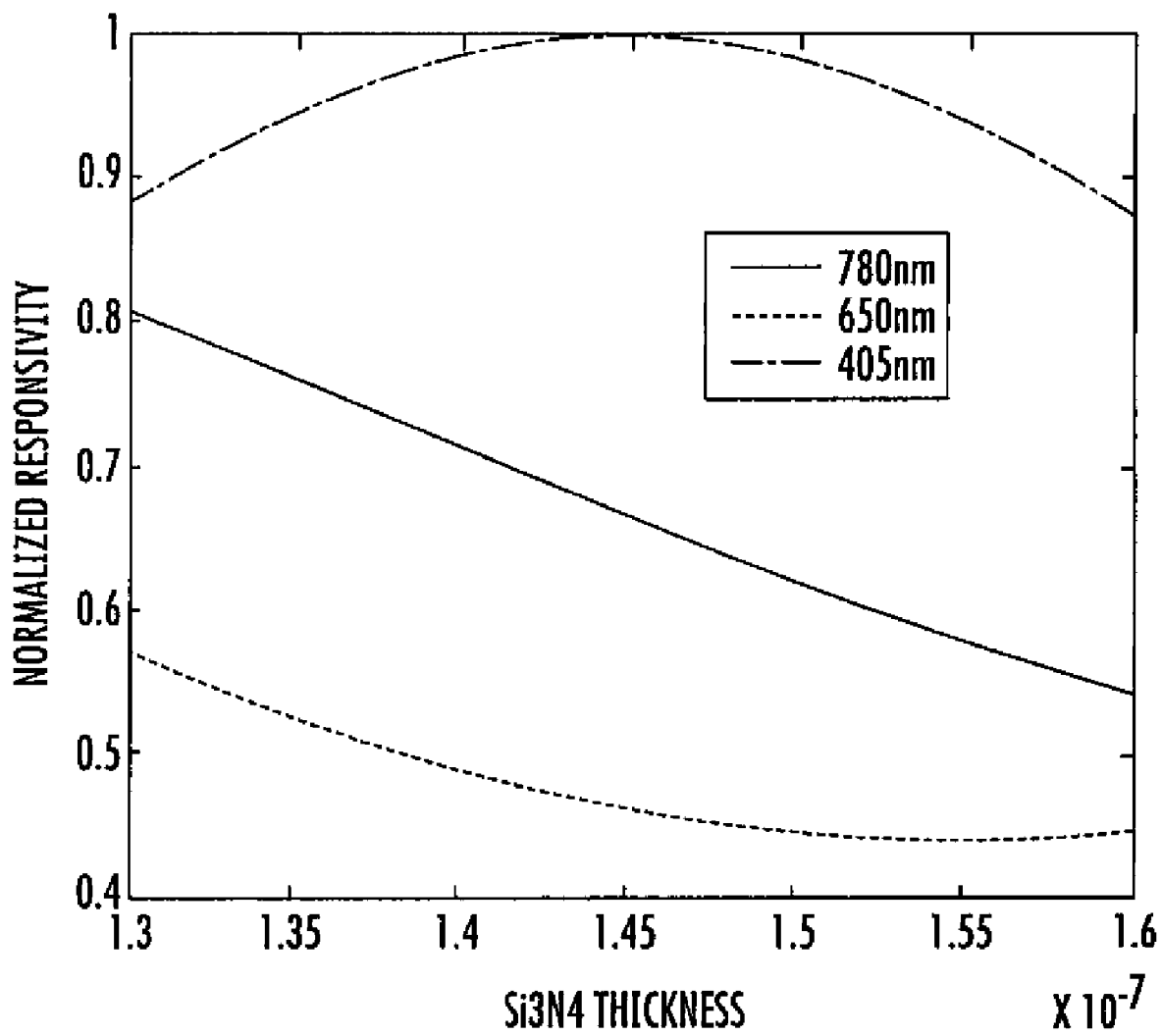
FIG. 8 shows the normalized response of a PD according to the invention at three wavelengths with the 3rd order nitride ARC thickness (optimized around the 405 nm operation) as a function of the ARC nitride layer thickness. It is noted that there is no efficiency variation based on a $SiO_2$ layer since there is no $SiO_2$ layer on top of the ARC layer.

FIG. 8 shows the normalized response of the PD with the 3rd order ARC (for 405 nm) thickness as a function of the ARC layer thickness (in tens of microns). The rate of change in responsivity can be seen to be low as a function of nitride thickness as compared to the change in responsivity as a function of oxide thickness as shown in FIG. 1. The nitride thickness can be changed to optimize a particular color, or obtain a desired ratio in color responsivitites.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

The invention claimed is:

1. A method of a fabricating a photodiode, comprising:
   (a) providing a substrate having a first semiconductor type surface region on at least a portion thereof;
   (b) implanting and thereby forming a second semiconductor type shallow surface layer into a portion of said surface region, wherein a photodiode region is formed by a pn-junction of the first semiconductor type surface region and the second semiconductor type shallow surface layer;
   (c) forming a multi-layer anti-reflective coating (ARC) on said shallow surface layer, wherein said multi-layer ARC comprises a thin oxide layer on said shallow surface layer and a second dielectric layer different from said thin oxide layer on said thin oxide layer;
   (d) forming an etch stop on said second dielectric, wherein said etch stop comprises at least one layer resistant to oxide etch;
   (e) forming at least one oxide comprising layer on said etch stop;
   (f) removing, down to said first semiconductor type surface region, at least a portion of said ARC, a portion of said etch stop and a portion of said at least one oxide comprising layer that are not above said photodiode region;
   (g) after step (f), performing at least some of interlayer dielectric (ILD) processing, metal processing, contact processing, via processing and passivation processing, which results in multiple layers being formed above said at least one oxide comprising layer;
   (h) removing at least a portion of said multiple layers formed at step (g) so that an opening down to said etch stop is provided over at least a portion of said photodiode region, wherein step (h) includes removing at least a portion of said at least one oxide comprising layer formed at step (e) using an oxide etch; and
   (i) removing at least a portion said etch stop that is over said photodiode region to expose to ambient at least a portion of said ARC that is over said photodiode region.

2. The method of claim 1, wherein said first semiconductor type is p-type and said second semiconductor type is n-type.

3. The method of claim 2, wherein said shallow surface layer comprises As or Sb.

4. The method of claim 1, wherein said first semiconductor type is n-type and said second semiconductor type is p-type.

5. The method of claim 1, wherein a thickness of said thin oxide layer is between 1.5 nm and 5 nm.

6. The method of claim 1, wherein said second dielectric layer comprises silicon nitride.

7. The method of claim 1, wherein following said removing said etch stop to expose at least a portion of said ARC to ambient, said etch stop remains on a periphery of said ARC.

8. The method of claim 1, wherein said layer resistant to oxide etch comprises silicon nitride or polysilicon.

9. A method of a fabricating a photodiode on a substrate including a surface region of a first semiconductor type, the method comprising:
   (a) forming a shallow surface layer of a second semiconductor type into a portion of the surface region of the first semiconductor type, wherein a photodiode region is formed by a pn-junction of the first semiconductor type surface region and the second semiconductor type shallow surface layer;
   (b) forming a multi-layer anti-reflective coating (ARC) above the shallow surface layer, the multi-layer ARC including an oxide layer above the shallow surface layer and a dielectric layer different from the oxide layer above the oxide layer;
   (c) forming an etch stop layer above the multi-layer ARC;
   (d) forming at least one oxide comprising layer above the etch stop layer;
   (e) removing at least a portion of said ARC, a portion of the etch stop and a portion of the at least one oxide comprising layer that are not above the photodiode region;
   (f) performing at least some of interlayer dielectric (ILD) processing, metal processing, contact processing, via processing and passivation processing, which results in multiple layers being formed above the at least one oxide comprising layer;
   (g) removing at least a portion of the multiple layers formed at step (f) and removing at least a portion of the at least one oxide comprising layer formed at step (d) above the etch stop layer so that at least a portion of the etch stop layer above the photodiode region is exposed, wherein during the removing at step (g) the etch stop layer prevents removal of layers below the etch stop layer; and
   (h) removing at least a portion of the etch stop layer that is over said photodiode region to expose at least a portion of the ARC that is over said photodiode region.

10. The method of claim 9, wherein the etch stop layer formed at step (c) includes a layer resistant to oxide etch.

11. The method of claim 10, wherein the layer resistant to oxide etch comprises at least one of silicon nitride and polysilicon.

12. The method of claim 9, wherein step (g) includes forming a photoresist mask above the multiple layers formed at step (f); and
   removing the multiple layers and the at least one oxide comprising layer excluding an area having the photoresist mask.

13. The method of claim 9, wherein following the removing of at least a portion of the etch stop to expose at least a portion of the ARC at step (h), the etch stop remains on a periphery of the ARC.

14. The method of claim 9, wherein the at least a portion of the ARC that is exposed, following the removing of at least a portion of the etch stop at step (h), is exposed to ambient.

15. The method of claim 9, wherein the first semiconductor type is p-type and the second semiconductor type is n-type.

16. The method of claim 9, wherein the first semiconductor type is n-type and the second semiconductor type is p-type.

17. The method of claim 9, wherein the shallow surface layer formed at step (a) comprises at least one of As and Sb.

18. The method of claim 9, wherein oxide layer formed at step (b) is formed to a thickness in the range of about 1.5 nm to 5 nm.

19. The method of claim 9, wherein the dielectric layer formed on the oxide layer at step (b) comprises silicon nitride.

* * * * *

UNITED STATES PATENT AND TRADEMARK OFFICE
CERTIFICATE OF CORRECTION

PATENT NO. : 7,485,486 B2                                  Page 1 of 1
APPLICATION NO. : 11/532762
DATED : February 3, 2009
INVENTOR(S) : Zheng et al.

It is certified that error appears in the above-identified patent and that said Letters Patent is hereby corrected as shown below:

On the Title Page

Item [*] Notice: Subject to any disclaimer, the term of this patent is extended or adjusted under 35 USC 154(b) by 128 days Delete the phrase "by 128 days" and insert -- by 174 days --

Signed and Sealed this

Sixteenth Day of March, 2010

David J. Kappos
*Director of the United States Patent and Trademark Office*